(12) United States Patent
Hiroe et al.

(10) Patent No.: US 7,267,128 B2
(45) Date of Patent: Sep. 11, 2007

(54) SUBSTRATE TREATING APPARATUS (75) Inventors: Toshio Hiroe, Kyoto (JP); Koji Hasegawa, Kyoto (JP); Ichiro Mitsuyoshi, Kyoto (JP); Yoshihiro Nishina, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 597 days.

(21) Appl. No.: 10/681,450

(22) Filed: Oct. 8, 2003

(65) Prior Publication Data

US 2004/0071531 A1    Apr. 15, 2004

(30) Foreign Application Priority Data

Oct. 10, 2002 (JP) ............................. 2002-297408
Aug. 25, 2003 (JP) ............................. 2003-300010

(51) Int. Cl.
*B08B 3/00* (2006.01)

(52) U.S. Cl. ............................. 134/61; 134/62; 134/63; 134/66; 134/69; 134/78; 134/80; 134/84; 134/85; 134/86; 134/89

(58) Field of Classification Search ................. 134/62, 134/63, 66, 69, 78, 84, 85, 86, 89, 80, 61
See application file for complete search history.

(56) References Cited

U.S. PATENT DOCUMENTS 6,198,201 B1 * 3/2001 Okumura ................ 310/323.03
6,259,960 B1 * 7/2001 Inokuchi ..................... 700/110

FOREIGN PATENT DOCUMENTS

JP    08-340035    12/1996
JP    11-289000    10/1999

* cited by examiner

*Primary Examiner*—Michael Kornakov
*Assistant Examiner*—Rita R Patel
(74) *Attorney, Agent, or Firm*—Ostrolenk, Faber, Gerb & Soffen, LLP (57) ABSTRACT

A substrate treating apparatus for treating substrates includes a treating tank for receiving and treating the substrates, a holding device movable, while holding the substrates in a cantilever mode, between a treating position in the treating tank and a transfer position above the treating tank, a transport device for supporting the substrates and transferring the substrates to and from the holding device in the transfer position, a detecting device for detecting a posture variation of the holding device, and a correcting device for correcting a position of the holding device or the transport device. The correcting device performs a correction according to the posture variation of the holding device detected by the detecting device in time of transfer of the substrates between the holding device and the transport device.

9 Claims, 12 Drawing Sheets

SUBSTRATE TREATING APPARATUS

BACKGROUND OF THE INVENTION (1) Field of the Invention

This invention relates to a substrate treating apparatus for treating semiconductor wafers, glass substrates for liquid crystal displays and the like (hereinafter called simply "substrates"). More particularly, the invention relates to a substrate treating apparatus having a holding device for holding substrates in a cantilever mode.

(2) Description of the Related Art

Conventionally, this type of substrate treating apparatus has a treating tank for treating substrates, a holding mechanism for holding a plurality of substrates in upstanding posture by contacting lower edges thereof, and for placing the substrates in the treating tank, and a transport mechanism for holding the substrates at side edges thereof and transferring the substrates to and from the holding mechanism (see Japanese Unexamined Patent Publications Nos. 8-340035 (1996) and 11-289000 (1999), for example).

The transport mechanism holds and moves the substrates to be treated above the holding mechanism, the holding mechanism subsequently moves upward relative to the transport mechanism, and the transport mechanism releases the substrates to be received by the holding mechanism. Then, the holding mechanism lowers to the treating tank to place the substrates in the treating tank for treatment. After the treatment, the holding mechanism moves up, and the transport mechanism holds the substrates and transports the substrates to a next treating tank, for example.

The conventional apparatus having such a construction has the following drawback.

With the conventional apparatus, treated substrates sometimes have scratches made in the circumferential direction at edges thereof. Such scratches on the substrates lower their quality such as by producing crystal defects in the substrates, rendering the substrates susceptible to damage, or producing particles to cause mutual contamination.

SUMMARY OF THE INVENTION

This invention has been made having regard to the state of the art, and its object is to provide a substrate treating apparatus for treating substrates with high quality, in which scratching of the substrates is prevented by correcting a displacement resulting from a posture variation occurring in time of substrate transfer.

Inventors have attained the following findings to fulfill the above object.

Inventors have noted that scratches are formed only on particular parts of substrates, and carefully observed the substrates in the treating process. Treated substrates are transferred from the holding mechanism to the transport mechanism. In time of the transfer, edges of the substrates fit into grooves of the transport mechanism. Inventors guessed that side surfaces of the grooves rubbed against the edges of the substrates. Further, based on the specific construction of the apparatus, the inventors took its mechanical strength into account and made the following guess.

Figure 1A:
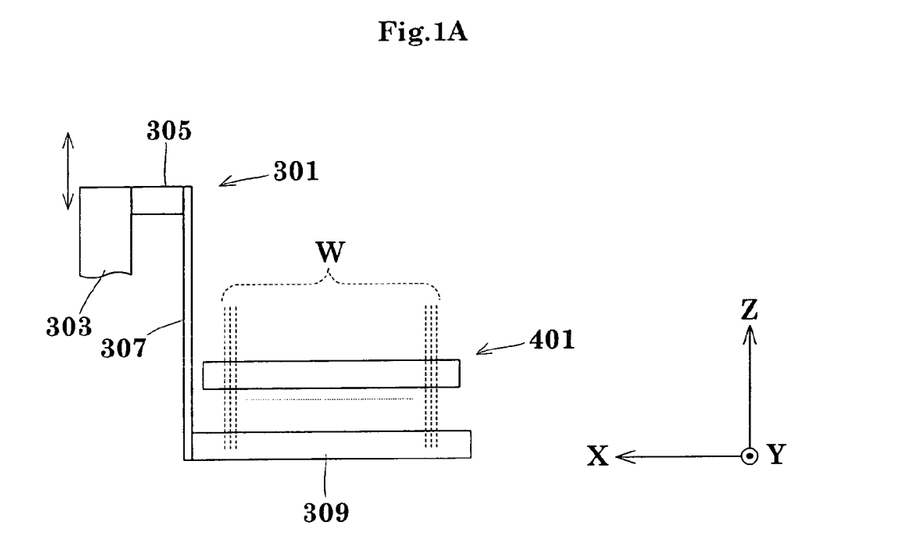
FIG. 1A shows a state of holding no substrates.
Figure 1B:
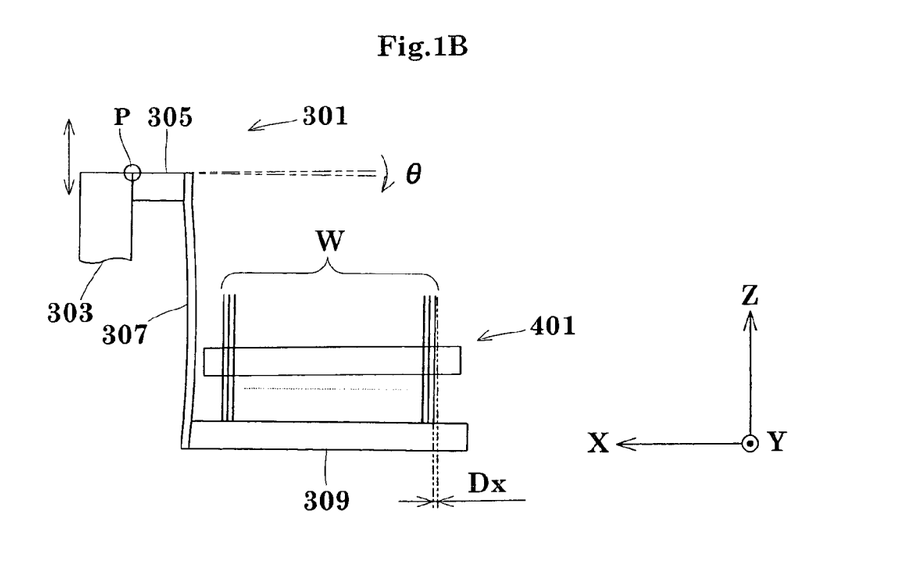
FIG. 1B shows a state of the holding mechanism holding substrates.

This will particularly be described with reference to FIG. 1. FIG. 1 shows side views of a holding mechanism and a transport mechanism of a conventional apparatus. FIG. 1A shows a state of holding no substrates, while FIG. 1B shows a state of the holding mechanism holding substrates.

The holding mechanism 301 is the cantilever type, and includes a vertically movable support post 303, a base 305 extending from an upper position of the support post 303 toward a treating tank, a depending portion 307 depending from the base 305, and a contact portion 309 defining grooves for contacting and supporting wafers W in upstanding posture. These components, when holding no wafers W, are maintained in such a positional relationship that can keep wafers W in vertical posture as shown in dotted lines in FIG. 1A. However, when the wafers W are loaded, as shown in FIG. 1B, the structure as a whole is presumed "deflected" about the Y-axis. With the mechanical strength taken into account, the "deflection" of the depending portion 307 is considered to have the greatest influence on posture variations of wafers W.

From the fact that scratches on the wafers W are found predominantly on particular principal surfaces (at plus side on the X-axis in the FIG. 1, opposed to the base 305), the wafers W are considered to have displaced toward the plus side on the X-axis relative to a specific relationship in transfer position between a transport mechanism 401 and the wafers W. It has been determined from the direction of displacement that the holding mechanism 305 carrying the wafers W, because of the cantilever construction, deflects in θ direction about a cantilever point P under the weight of wafers W. As a result, the entire holding mechanism 301 is displaced in the plus direction on the X-axis from a predetermined transfer position relative to the transport mechanism 401, and the wafers W mounted thereon are also displaced accordingly.

This displacement was confirmed through measurement using a laser displacement gauge having a position detecting resolution of the μm order. Specifically, when 20 wafers W of φ300 mm were loaded, a horizontal displacement Dx was about 0.2 mm, and when 50 such wafers W were loaded, the horizontal displacement Dx measured about 0.5 mm. When this displacement is large, the wafers W cannot be transferred in the worst case.

Based on the above findings, this invention provides a substrate treating apparatus for treating substrates, comprising a treating tank for receiving and treating the substrates, a holding device movable, while holding the substrates in a cantilever mode, between a treating position in the treating tank and a transfer position above the treating tank, a transport device for supporting the substrates and transferring the substrates to and from the holding device in the transfer position, a detecting device for detecting a posture variation of the holding device, and a correcting device for correcting a position of one of the holding device and the transport device, wherein the correcting device performs a correction according to the posture variation of the holding device detected by the detecting device in time of transfer of the substrates between the holding device and the transport device.

The detecting device detects a posture variation of the holding device, and the correcting device adjusts the position of the holding device or transport device according to the posture variation detected in time of transfer of the substrates. In this way, a displacement caused by the posture variation may be corrected to maintain a normal relationship in transfer position between the holding device and the transport device. Consequently, the substrates are maintained free from scratches to realize high-quality treatment of the substrates.

In this invention, the correcting device, preferably, includes a support device for supporting the holding device to be rockable about a cantilever point of the holding device, and a drive device for rocking the holding device about the cantilever point.

The holding device, because of its construction, undergoes a posture variation about the cantilever point. A displacement caused by the posture variation may be corrected by operating the drive means to rock the support device.

Preferably, the correcting device includes a through hole formed in a cantilever proximal portion of the holding device, a rigid member inserted into the through hole, and a positioning device for moving the holding device, by using the rigid member, in an opposite direction to a direction of movement of a cantilever point of the holding device.

The rigid member inserted into the through hole is fixed in position. The positioning device utilizes the rigid member in an adjusting operation for moving the holding device with respect to the direction of movement of the cantilever point of the holding device, thereby correcting a displacement caused by the positional variation.

Preferably, the detecting device includes a laser displacement gauge or an image processing device for performing a detection from a position spaced from the holding device.

Positional variations occur in the order of microns. Such variations may suitably be detected by a laser displacement gauge or an image processing device such as a camera that is capable of high-accuracy measurement.

Preferably, the correcting device performs a correction based on a posture of the holding device unloaded with the substrates.

The posture of the holding device not holding the substrates is regarded as a reference posture. A displacement therefrom constitutes a posture variation due to loading of the substrates. Based on this, the correcting device performs a correction to correct the displacement caused by the posture variation.

Preferably, the correcting device performs a correction successively while the holding device shifts between an unloaded state and a substrate holding state.

When the substrates are transferred between the holding device and transport device, a load is applied at a point of time when edges of the substrates come into contact, to start a posture variation. When the transfer is completed, the posture variation reaches its maximum and is maintained in this state. Thus, the substrates could be scratched as a result of a displacement caused by a posture variation occurring even before completion of the transfer of the substrates. A continuous correction carried out in the course of transfer will minimize the probability of scratches inflicted on the substrates, such scratches being only negligible if at all.

Preferably, the correcting device includes an advance/retreat drive device for advancing and retreating the support device along a substrate supporting side.

Strictly speaking, a posture variation cannot be corrected completely only by rocking about the cantilever point. With the advance/retreat drive device, a posture variation can be corrected substantially completely.

Preferably, the drive device includes a cam or a piezoelectric element, while the support device includes a goniostage or a spherical seat.

A posture can be corrected with a relatively simple mechanism by using a cam. A piezoelectric element allows the correcting device to have a further simplified construction. Where a goniostage or a spherical seat is employed, the support portion of the holding device may have a large sliding area. This stabilizes the posture of the holding device or transport device while allowing the posture to be corrected.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 1 is a side view of a holding mechanism and a transport mechanism in the prior art, in which

DESCRIPTION OF THE PREFERRED EMBODIMENTS

Embodiment 1

One embodiment of the invention will be described hereinafter with reference to the drawings.

Figure 2:
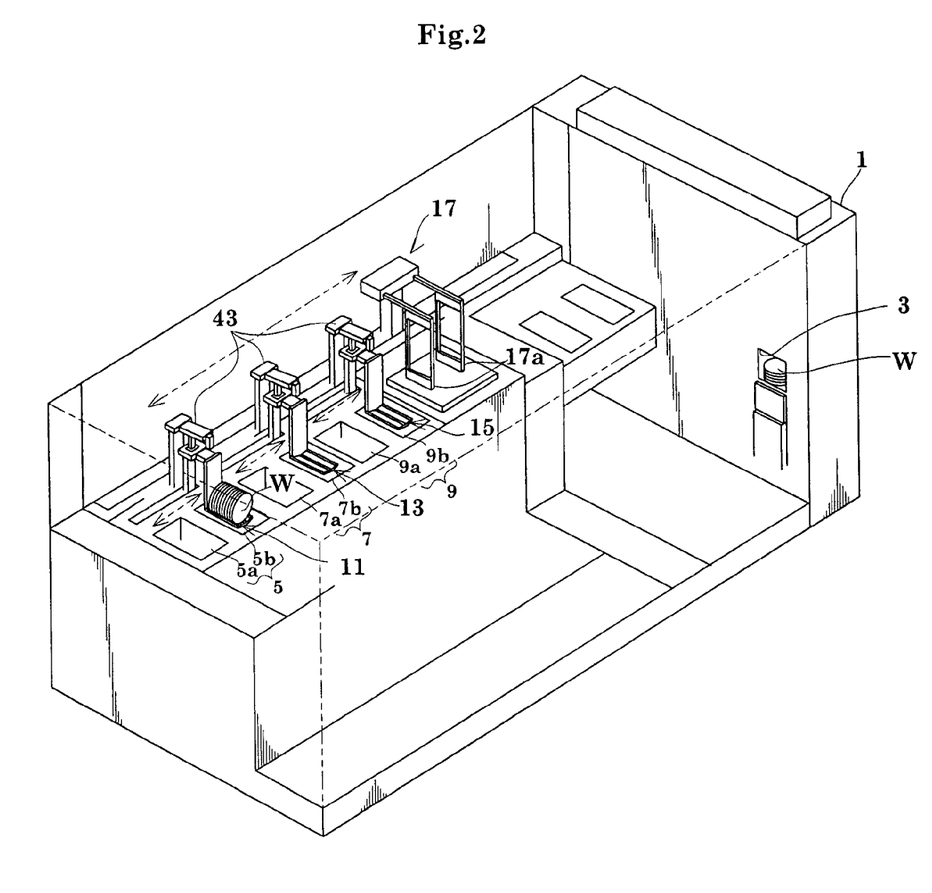
FIG. 2 is a perspective view showing an outline of a substrate treating apparatus in embodiment 1.
Figure 3:
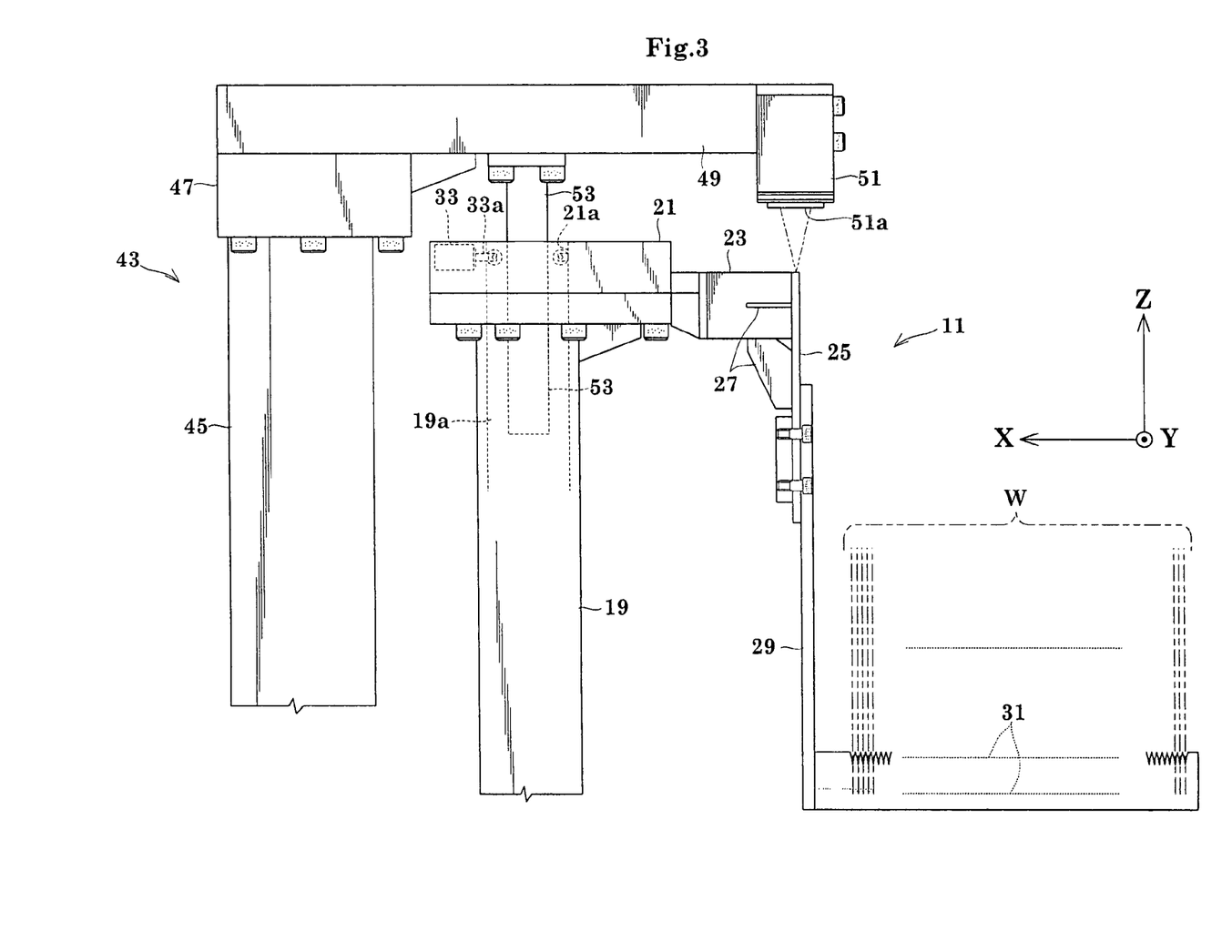
FIG. 3 is a side view showing an outline of an auxiliary transport mechanism.
Figure 4:
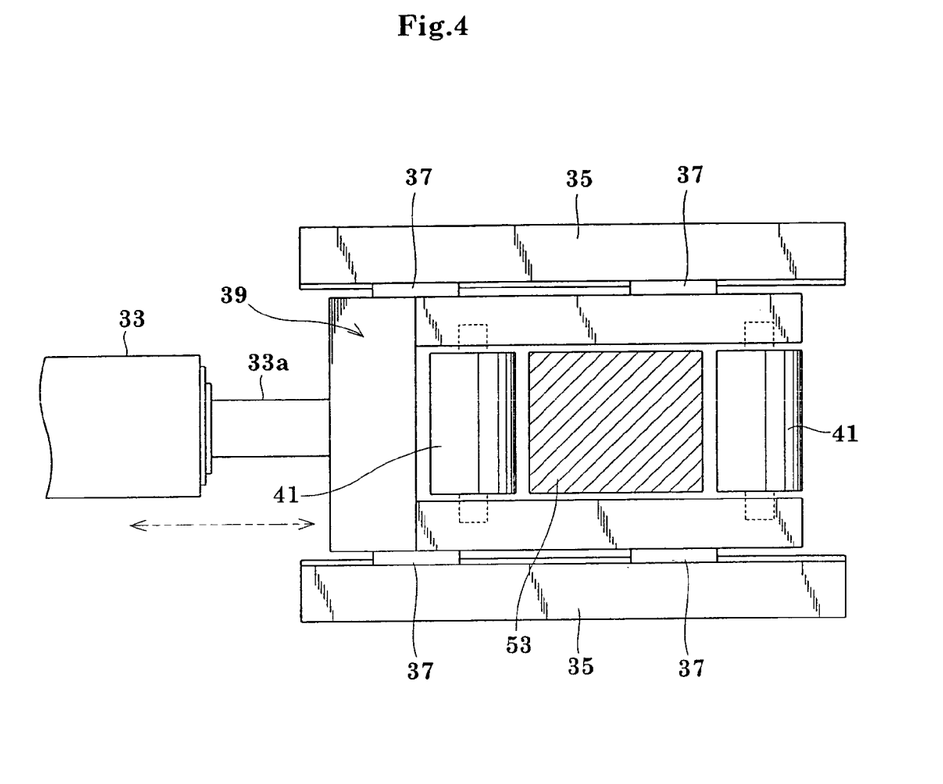
FIG. 4 is a plan view of a correcting mechanism.
Figure 5:
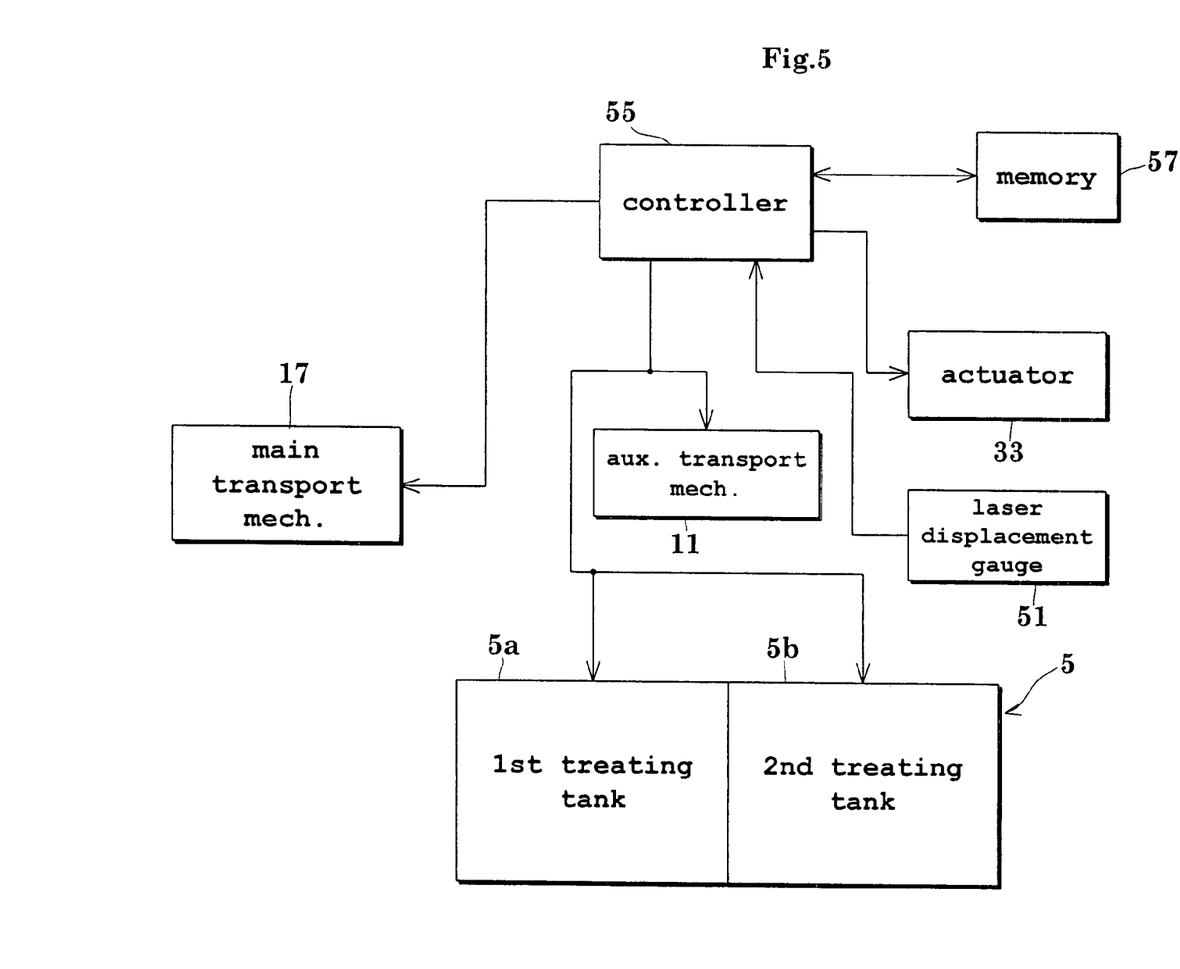
FIG. 5 is a block diagram of the substrate treating apparatus.

FIGS. 2 through 5 show one embodiment of the invention. FIG. 2 is a perspective view showing an outline of a substrate treating apparatus in embodiment 1. FIG. 3 is a side view showing an outline of an auxiliary transport mechanism. FIG. 4 is a plan view of a correcting mechanism. FIG. 5 is a block diagram of the substrate treating apparatus.

This substrate treating apparatus is constructed mainly for cleaning wafers W. The apparatus includes a front panel 1 located in a deep end position in FIG. 2 and defining a substrate passage 3. A plurality of treating units are arranged in a row located opposite the substrate passage 3.

For example, cleaning units 5, 7 and 9 are arranged in order from the end remote from the front panel 1. Each of the cleaning units 5, 7 and 9 has an auxiliary transport mechanism 11, 13 or 15 for moving a plurality of wafers W only between a first treating tank 5a, 7a or 9a and a second treating tank 5b, 7b or 9b. A main transport mechanism 17 is disposed at the front side of the cleaning unit 9 for transporting one lot of wafers W to each of the cleaning units 5, 7 and 9. The main transport mechanism 17 is movable to all of the cleaning units 5, 7 and 9 to transfer the wafers W to and from only the first treating tanks 5a, 7a and 9a of the cleaning units 5, 7 and 9.

The main transport mechanism 17 has two movable arms 17a. Each arm 17a has a plurality of grooves (not shown) for receiving wafers W, to hold the wafers W in upstanding posture in the state shown in FIG. 2. The arms 17a release the wafers W by swinging from a "V" position to an inverted "V" position as seen from the front (from a lower rightward direction in FIG. 2).

The above main transport mechanism 17 corresponds to the transport device in this invention. The auxiliary transport mechanisms 11, 13 and 15 correspond to the holding device in this invention.

The auxiliary transport mechanisms 11, 13 and 15 have the same construction. The following description will be made by taking the auxiliary transport mechanism 11 for example.

The auxiliary transport mechanism 11 transports wafers W between the first treating tank 5a and second treating tank 5b. It is adjacent the second treating tank 5b that the auxiliary transport mechanism 11 receives wafers W to be treated and delivers treated wafers W. A main column 19 is fixed in a lower position thereof to a lift mechanism not shown, to be movable vertically along the Z-axis. The main column 19 has at least two vertically spaced positions, i.e. a lowermost "treating position" for placing the wafers W in the first treating tank 5a or second treating tank 5b, and a "transfer position" for transferring the wafers W to and from the main transport mechanisms 17. This main column 19 has a hollow portion 19a.

A mounting member 21 is attached to an upper position of the main column 19. The mounting member 21 defines an opening 21a in communication with the hollow portion 19a of the main column 19. The mounting member 21 has an extension 23 projecting in the X-direction toward the treating tanks, and a depending member 25 is attached to the extension 23 to extend vertically. The extension 23 has a reinforcement for fixedly maintaining the depending member 25, in a thin plate form, at an angle of about 90 degrees.

The opening 21a corresponds to the through hole in this invention.

A support 29 is attached to the depending member 25. The support 29 is in the form of a thin plate, and has three seating members 31 projecting from lower positions thereof. The three seating members 31 are arranged to contact and support wafers W at lower edges thereof, and each defines a plurality of grooves in an upper surface thereof for loosely receiving the edges of wafers W. The seating members 31 hold a plurality of wafers W in upstanding posture in the Y-direction.

The mounting member 21 has, embedded therein, an actuator 33 corresponding to the positioning device in this invention. The actuator 33 has a working piece 33a movable into and out of the opening 21a. A pair of rails 35 are arranged on inner walls of the opening 21a to extend in the X-direction along which the working piece 33a is movable. The rails 35 have four pairs of linear guides 37 attached thereto. The linear guides 37 carry a support frame 39 U-shaped in plan view and opening sideways. The support frame 39 has a pair of rollers 41 rotatably attached thereto and spaced from each other by a predetermined distance. A base post 53 described hereinafter is inserted between the pair of rollers 41.

A correcting unit 43 corresponding to the correcting device in this invention is erected adjacent the second treating tank 5b and at the back of the auxiliary transport mechanism 11 (opposite the seating members 31 across the main column 19). The correcting unit 43 includes a main column 45 fixed horizontally and vertically. The main column 45 has a mounting member 47 disposed on an upper end thereof, and a fixed arm 49 is attached to the upper end of the mounting member 47. The fixed arm 49 has a laser displacement gauge 51 attached to a distal end thereof. The laser displacement gauge 51 which corresponds to the detecting device in this invention is disposed to have an axis of measurement extending in the Z-direction, with a measuring window 51a opposed to the upper end surface of the depending member 25. This laser displacement gauge 51 is used to detect posture variations (deflections), and displacements resulting therefrom, of the auxiliary transport mechanism 11.

The base post 53 which corresponds to the rigid member in this invention is attached to an intermediate position on the lower surface of the fixed arm 49. The base post 53 is inserted between the pair of rollers 41 when the auxiliary transport mechanism 11 has moved to the transfer position.

Preferably, the above correcting unit 43 is formed of materials selected, and is appropriately reinforced, to have higher rigidity than the auxiliary transport mechanism 11. For example, the main column 45 may be formed of a material of higher rigidity and with a larger cross section than the main column 19. The fixed arm 49 may be formed of a material of higher rigidity than the extension 23.

The block diagram of FIG. 5 refers.

The auxiliary transport mechanisms 11, 13 and 15, main transport mechanism 17, cleaning units 5, 7 and 9 and the correcting units 43 are controlled en bloc by a controller 55. The controller 55 has a CPU and memory, and controls operation of the various components to transport wafers W to the respective cleaning units 5, 7 and 9 and treat the wafers W according to a predetermined recipe. The recipe is stored in a memory 57.

The memory 57 stores also a "reference position" measured by the laser displacement gauge 51. This "reference position" is stored for each of the auxiliary transport mechanisms 11, 13 and 15, and corresponds to a state in which the seating members 31 are not loaded with wafers W (the state shown in FIG. 3). The "reference position" is measured before treatment of wafers W, i.e. before each of the auxiliary transport mechanisms 11, 13 and 15 in the transfer position receives wafers W, and is stored in the memory 57. When one of the auxiliary transport mechanisms 11, 13 and 15 transfers wafers W to the main transport mechanism 17, the controller 55 compares a "measured position" corresponding to output from the laser displacement gauge 51 and the "reference position", and drives the actuator 33 so that the measured position approach or move a predetermined distance past the reference position.

Figure 6:
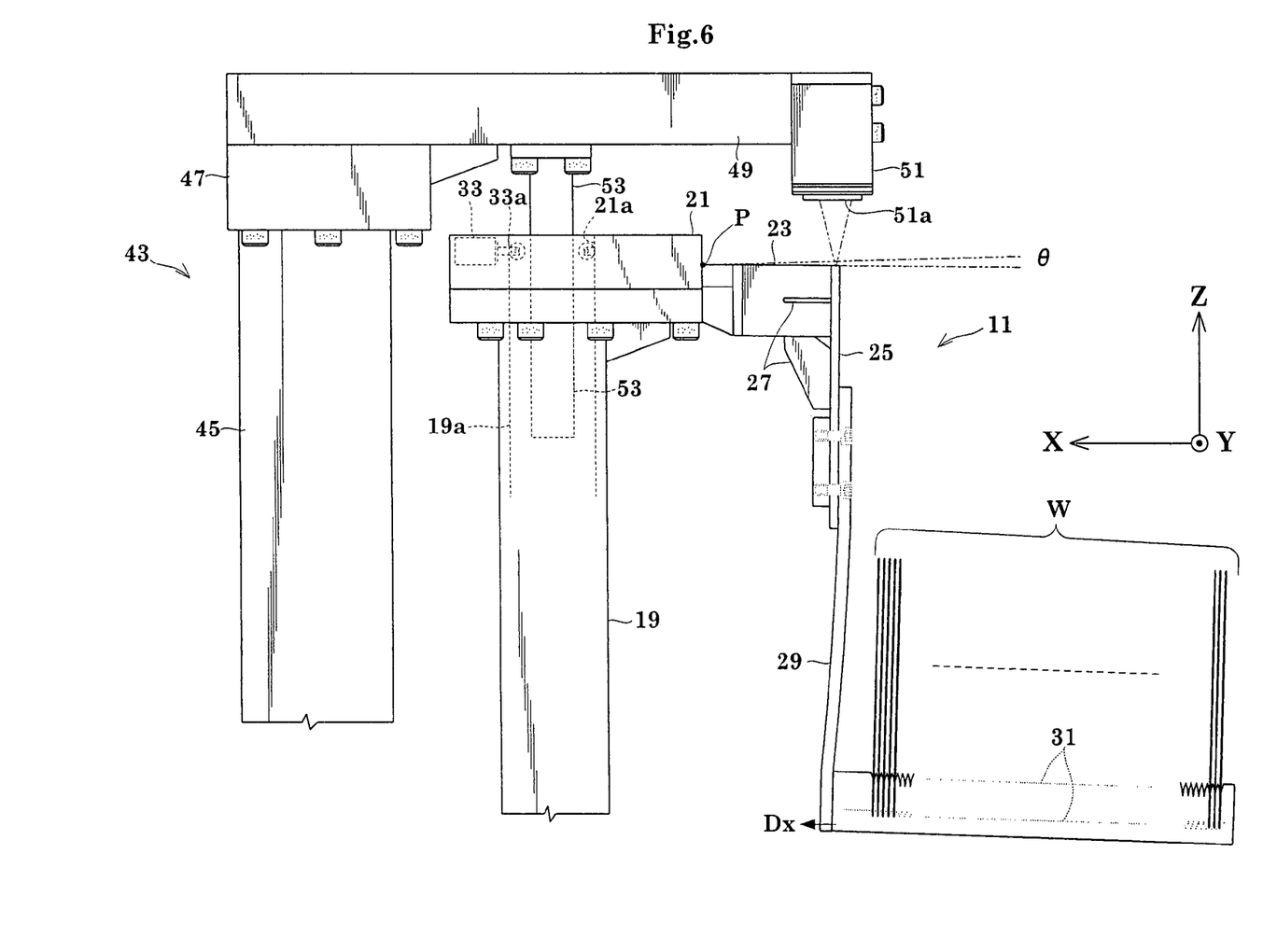
FIG. 6 is a side view showing a posture variation.
Figure 7:
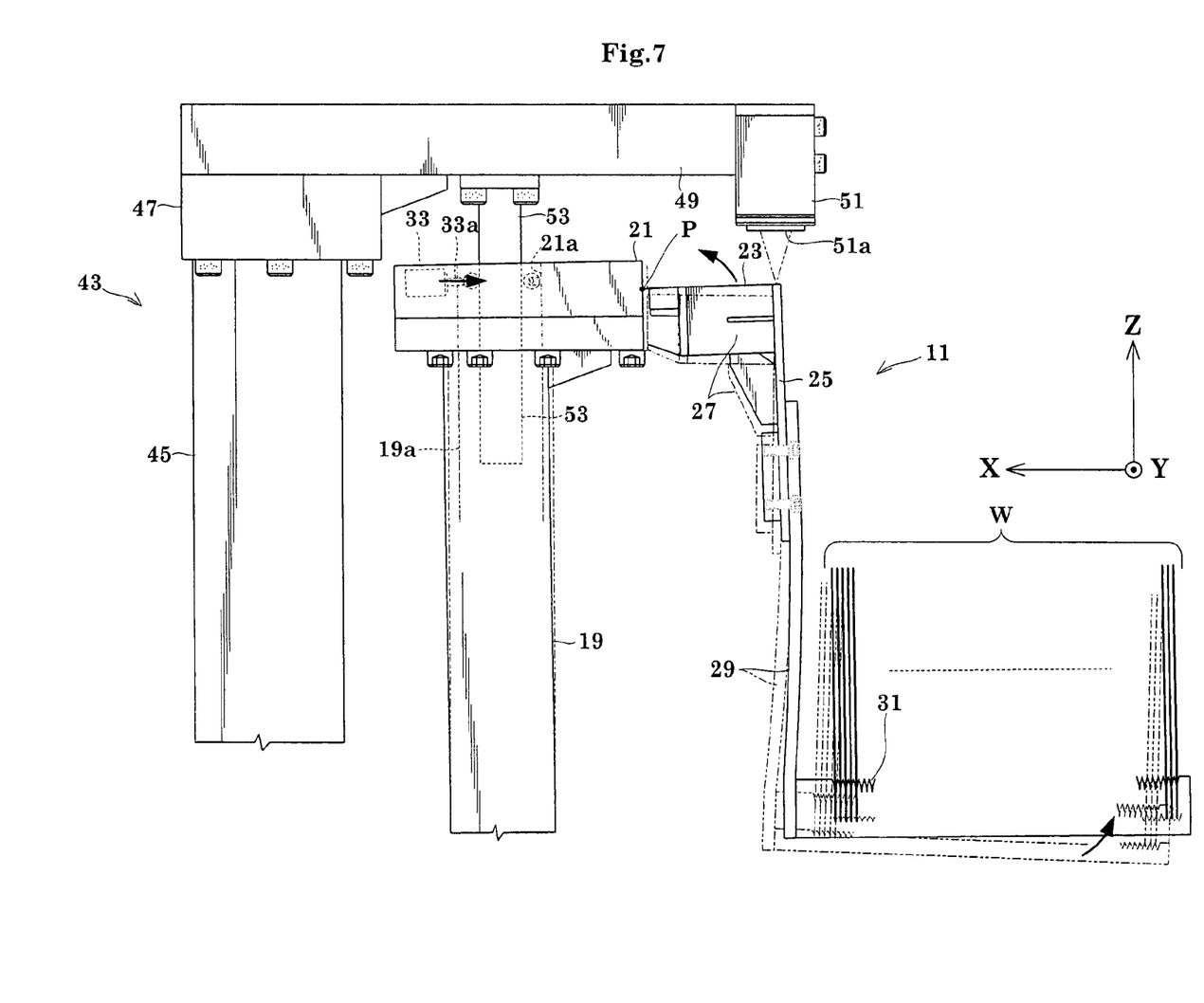
FIG. 7 is an explanatory view of an operation for correcting the posture variation.

Next, operation of the above substrate treating apparatus will be described with reference to FIGS. 6 and 7.

For example, the main transport mechanism 17 carrying a plurality of wafers W moves to the second treating tank 5b of the cleaning unit 5. Next, the auxiliary transport mechanism 11 moves up to the transfer position, and the main transport mechanism 17 spreads open the arms 17a to transfer the wafers W to the seating members 31 of the auxiliary transport mechanism 11. This state is shown in FIG. 6. In this state, the wafers W are lowered into the second treating tank 5b for a predetermined treatment. After a predetermined time, the auxiliary transport mechanism 11 is raised to the transfer position again where the arms 17a are open on standby.

When the auxiliary transport mechanism 11 has the seating members 31 loaded with the plurality of wafers W, the depending member 25 and support 29 in the form of thin plates are curved under the weight of wafers W, to undergo, as a whole, a posture variation about a cantilever point P. Consequently, the wafers W as a whole are displaced toward the plus side in the X-direction, which constitutes a horizontal displacement Dx. Naturally, the horizontal displacement Dx due to the posture variation is accompanied by a displacement in the Z-direction also.

The laser displacement gauge 51 measures this vertical displacement. The controller 55 compares the vertical displacement with the "reference position" stored in the memory 57, and drives the actuator 33 to eliminate the difference. Specifically, the auxiliary transport mechanism 11 is controlled to move in the direction opposite to the movement of the cantilever point P of the auxiliary transport mechanism 11. That is, the working piece 33a of the actuator 33 is extended to press one of the rollers 41 against the base post 53. Then, the actuator 33 moves in the opposite direction by reaction, to move the cantilever point P back toward the original position. The working piece 33a of the actuator 33 is stopped and maintained still when the measured position provided by the laser displacement gauge 51 is substantially in agreement with the reference position, or is a predetermined distance higher than the reference position to take into account the posture variation including the deflection of the members. Consequently, as shown in FIG. 7, the seating members 31 are raised in the Z-direction to eliminate or reduce the horizontal displacement Dx to almost zero. It is desirable to drive the actuator 33 at this time by feedback control in order to increase accuracy.

By correcting the displacement due to the posture variation as described above, the mutual positional relationship in the transfer position may be maintained normal. The arms 17a are closed to hold the wafers W in an appropriate position. Thus, the wafers W are maintained free from scratches to realize high-quality treatment of the wafers W.

In the above embodiment, the actuator 33 is disposed in the mounting member 21. Instead, the actuator 33 may be disposed in the base pole 53 to press against the mounting member 21, which realizes the same function and effect.

In the above description, the displacement due to the posture variation is corrected before transferring the wafers W from the auxiliary transport mechanism 11 to the main transport mechanism 17. A correction may be made successively by means of feedback on loading of the wafers W received from the main transport mechanism 17.

That is, when wafers W are transferred between the auxiliary transport mechanism 11 and main transport mechanism 17, a load is applied at a point of time when edges of wafers W come into contact, to start a posture variation. When the transfer is completed, the posture variation reaches its maximum and is maintained in this state. Thus, the wafers W could be scratched as a result of a displacement caused by a posture variation occurring even before completion of the transfer of the wafers W. A continuous correction carried out in the course of transfer will minimize the probability of scratches inflicted on the wafers W, such scratches being only negligible if at all.

Embodiment 2

Figure 8:
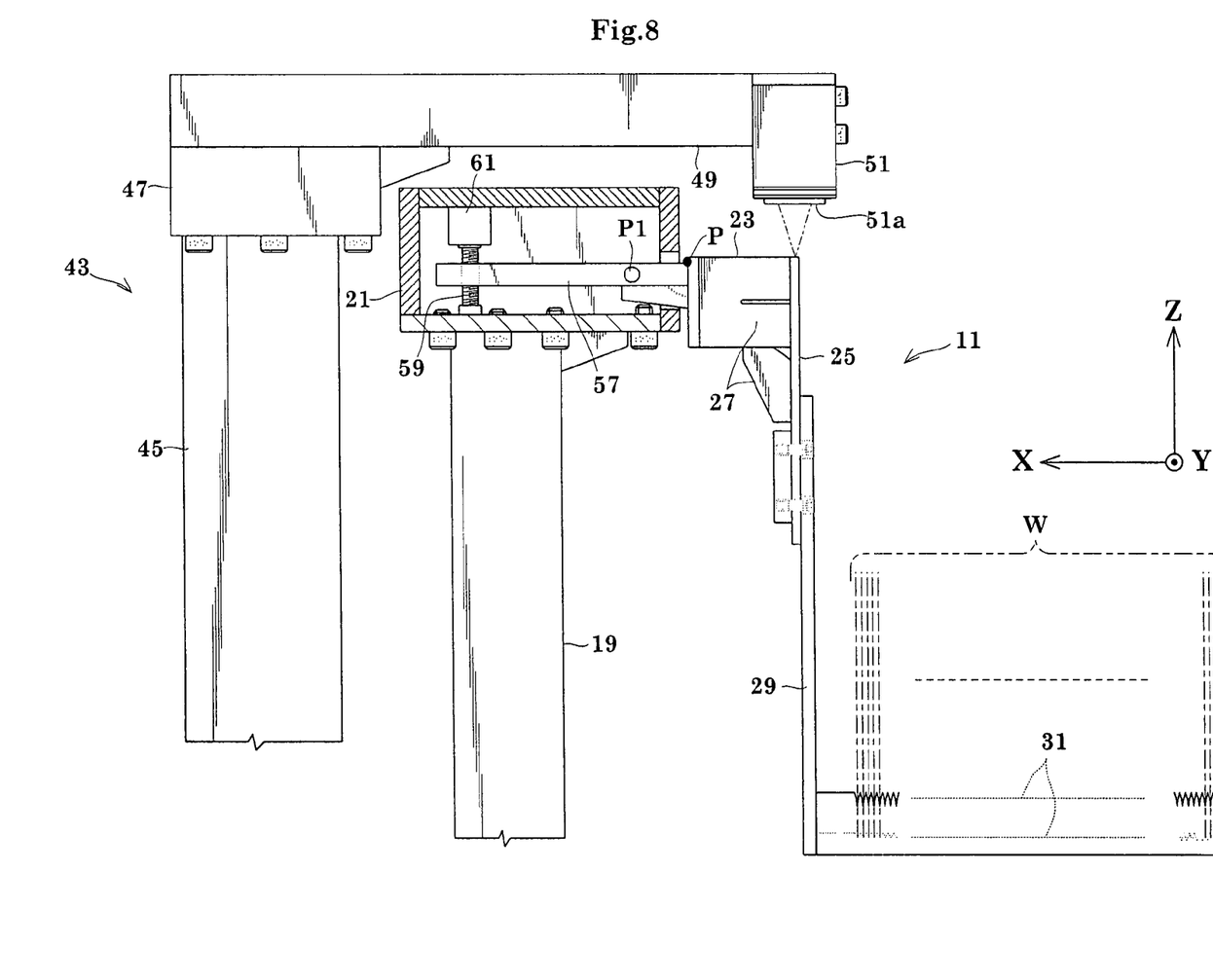
FIG. 8 is a side view, partly in section, showing an outline of an auxiliary transport mechanism in a substrate treating apparatus in embodiment 2.

FIG. 8 is a side view, partly in section, showing an outline of an auxiliary transport mechanism in a substrate treating apparatus in embodiment 2. In the following description, like reference numerals are used to identify like parts which are the same as in embodiment 1 and will not particularly be described again.

The mounting member 21 has, arranged therein, a support shaft 57 (support device) connected to the extension 23, a pivotal point P1 of the support shaft 57, a ball screw 59 extending in the Z-direction and meshed with the support shaft 57 in a position remote from the extension 23 across the pivotal point P1, and a motor 61 (drive device) for rotating the ball screw 59.

The motor 61 is reversibly operable to rotate the ball screw 59 and move the end of the support shaft 57 up and down about the pivotal point P1. As a result, the seating members 31 of the auxiliary transport mechanism 11 rock about the cantilever point P.

The above construction produces the same effect as the first embodiment for correcting a displacement due to a posture variation, to prevent scratches being formed on wafers W.

Modifications of the Detecting Device

Next, other embodiments of the above construction for detecting a posture variation will be described.

(First Modification)

Figure 9:
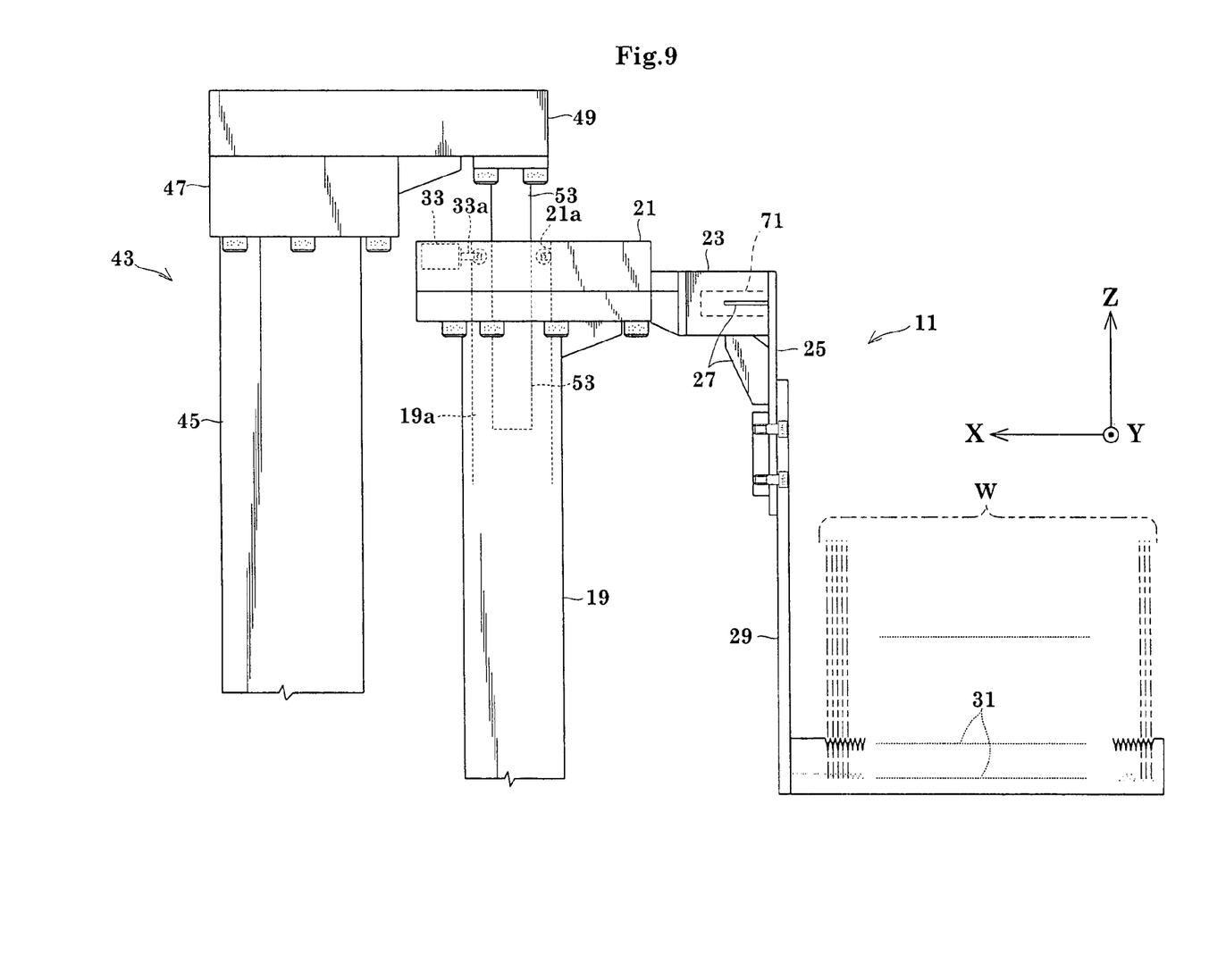
FIG. 9 is a schematic view showing a construction with a built-in detecting device.

FIG. 9 refers. FIG. 9 is a schematic view showing a construction with a built-in detecting device.

An angular acceleration detector 71 is mounted in the extension 23 forming part of a proximal structure of the auxiliary transport mechanism 11. The angular acceleration detector 17 may comprise a gyro sensor, for example, for detecting angular acceleration to detect a posture of an object.

This construction eliminates the need to extend the fixed arm 49 and attach the laser displacement gauge 51 to the distal end thereof, thereby achieving a simplification.

The above angular acceleration detector 71 may be replaced with a strain gauge or a piezoelectric element.

(Second Modification)

Figure 10:
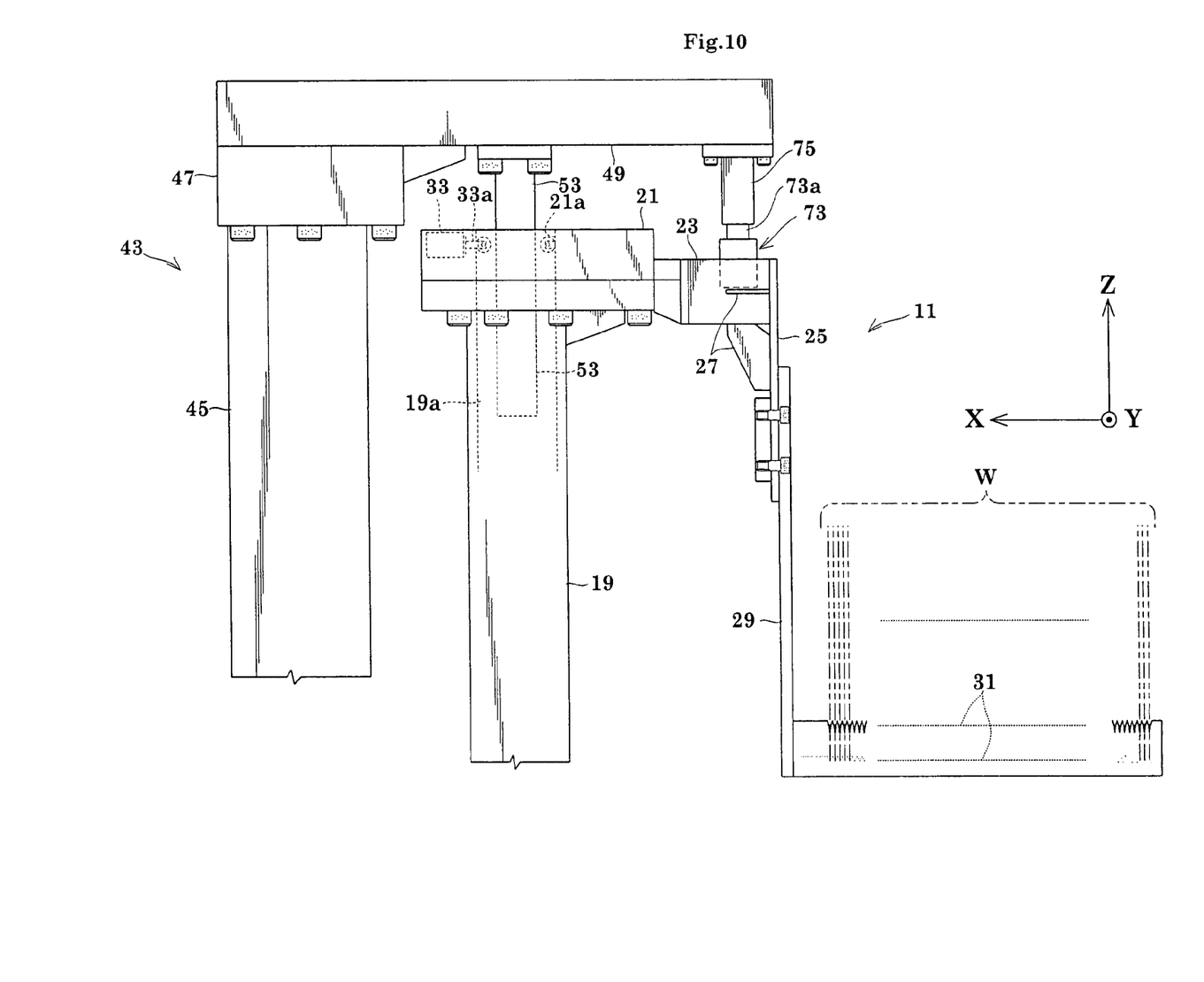
FIG. 10 is a schematic view showing a construction with a contact type detecting device.

FIG. 10 refers next. FIG. 10 is a schematic view showing a construction with a contact type detecting device.

This example includes a linear encoder 73 acting as the contact type detecting device. The linear encoder 73 has a detecting piece 73a extendible and retractable for detecting even a minute displacement. The linear encoder 73 is mounted in the extension 23 with the detecting piece 73a projecting above the extension 23. A detected piece 75 is disposed above the linear encoder 73, and attached to a lower surface at the distal end of the fixed arm 49. The upper surface of the detecting piece 73a is in contact with the lower surface of the detected piece 75.

This linear encoder 73 may be replaced with a contact type displacement gauge.

The contact type detecting device may be mounted, not in the extension 23, but at a distal end of a fixed member erected on an upper surface of the cleaning unit 5, with the detecting piece 73a contacting the lower surface of the extension 23. This contact type detecting device is retractable sideways in time of vertical movement of the auxiliary transport mechanism 11.

Modifications of the Drive Device

Next, other embodiments of the drive device noted hereinbefore will be described.

(First Modification)

Figure 11:
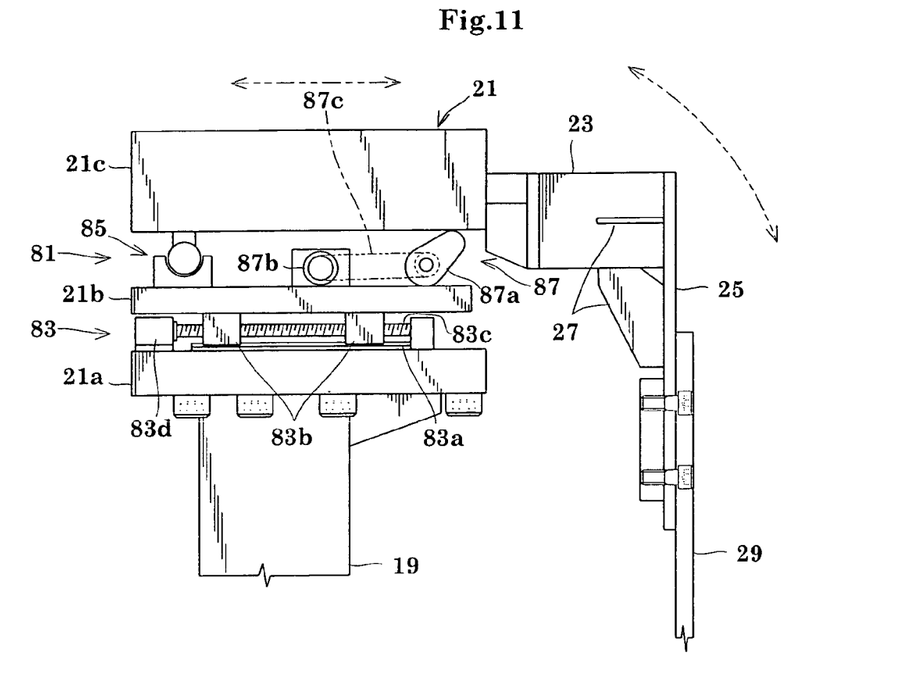
FIG. 11 is a schematic view showing a drive device with a cam.

FIG. 11 refers. FIG. 11 is a schematic view showing a drive device with a cam.

The mounting member 21 has, arranged therein, a positioning mechanism 81 and an advance/retreat drive device 83. The mounting member 21 includes a lower tier 21a mounted on the main column 19, a middle tier 21b and an upper tier 21c. The extension 23 is attached only to the upper tier 21c. The positioning mechanism 81 is disposed between the middle tier 21b and upper tier 21c.

The positioning mechanism 81 includes a bearing portion 85 and a cam mechanism 87. The bearing portion 85 supports, with a rotary shaft rotatable about a horizontal axis, a position of the upper tier 21c remote from the extension 23. The cam mechanism 87 includes a cam 87a supported eccentrically by a rotary shaft rotatable about a horizontal axis, a rotary motor 87b, and a timing belt 87c interlocking the cam 87a to a rotary shaft of rotary motor 87b. The cam 87a has opposite ends thereof slidable on the lower surface of upper tier 21c and the upper surface of middle tier 21b.

The advance/retreat drive device 83 includes a guide rail 83a laid on the upper surface of lower tier 21a, linear guides 83b slidably fitted on the guide rail 83a and attached to the lower surface of middle tier 21b, a ball screw 83c meshed with the linear guides 83b, and a rotary motor 83d for driving the ball screw 83c.

When the rotary motor 83d is operated, the middle tier 21b and upper tier 21c move linearly toward the depending member 25 (toward wafers W). When the rotary motor 87b is operated, the cam 87a rotates to rock the depending member 25 about the bearing portion 85 defining a horizontal axis. Thus, with the dual structure of the mounting member 21 having the upper layer and lower layer, the upper layer is rockable by the positioning mechanism 81 and the lower layer reciprocable by the advance/retreat drive device 83, to correct posture variations efficiently.

This construction having the cam 87a is capable of correcting posture with a relatively simple mechanism. Strictly speaking, a posture variation cannot be corrected completely only by rocking about the cantilever point. With the advance/retreat drive device 83 for causing movement toward the wafers W, a posture variation can be corrected substantially completely.

(Second Modification)

Figure 12:
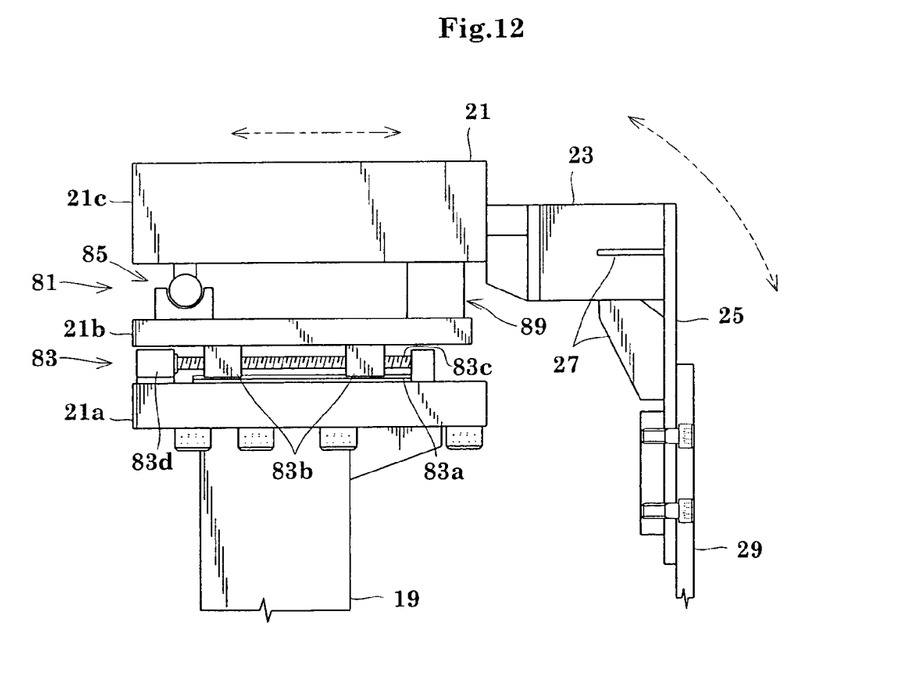
FIG. 12 is a schematic view showing a drive device with a piezoelectric element.

FIG. 12 refers. FIG. 12 is a schematic view showing a drive device with a piezoelectric element.

In this example, a piezoelectric element 89, instead of the cam mechanism 87, is disposed between the middle tier 21b and upper tier 21c. The piezoelectric element 89 is arranged deformable in the vertical direction. When a voltage is applied according to a posture variation, outer dimensions of the piezoelectric element 89 are varied by an inverse piezoelectric effect according to the voltage.

With this construction, the upper tier 21c may be rocked by a voltage applied according to a posture variation, to rock the extension 23. This construction is simplified further than the foregoing examples.

(Third Modification)

Figure 13:
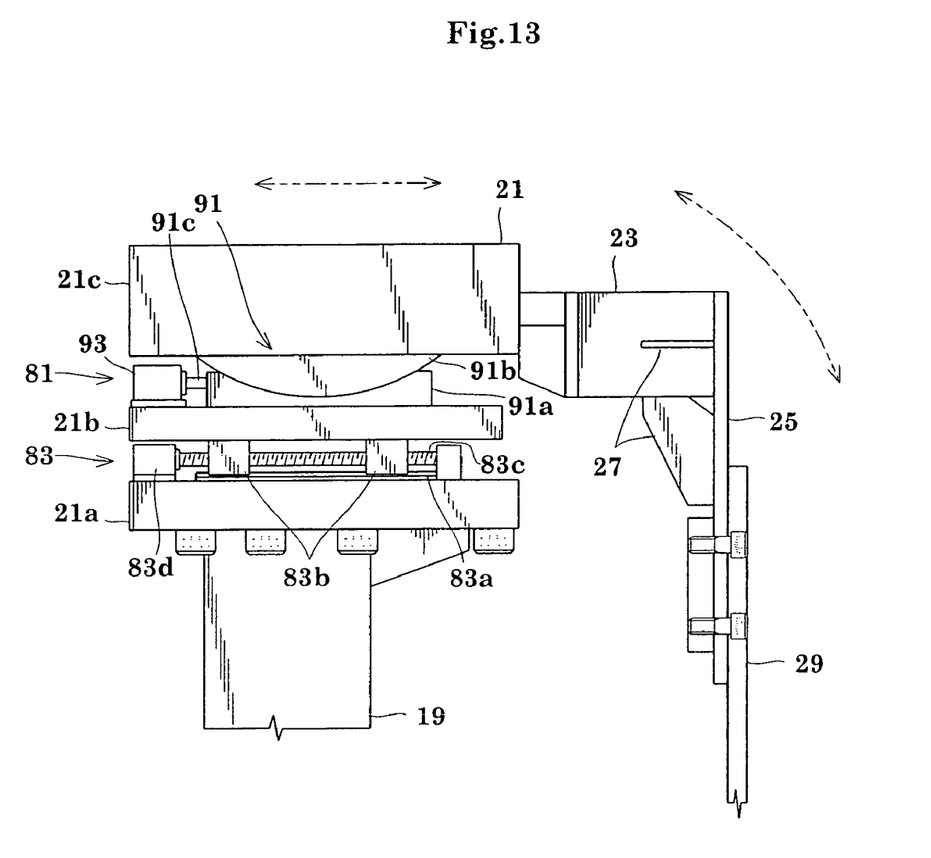
FIG. 13 is a schematic view showing a drive device with a goniostage.

FIG. 13 is refers. FIG. 13 is a schematic view showing a drive device with a goniostage.

A goniostage 91 is mounted between the middle tier 21b and upper tier 21c. The goniostage 91 has a fixed stage 91a attached to the upper surface of middle tier 21b, and an operating stage 91b rockable on the fixed stage 91a is attached to the lower surface of upper tier 21c. A drive shaft 91c extending from a side surface of fixed stage 91a for rocking the operating stage 91b is connected to a rotary shaft of a rotary motor 93 mounted on the upper surface of middle tier 21b.

Where the goniostage 91 is employed as described above, a large slide area or support area is secured in the support portion of the auxiliary transport mechanism 11 (holding device). This feature has an advantage of stabilizing posture in time of correction.

The above goniostage 91 may be replaced with a spherical seat to achieve the same effect.

This invention is not limited to the first and second embodiments described above, but may be modified as follows, for example:

(1) The substrate cleaning apparatus has been described as an example of substrate treating apparatus. The invention may be applied to apparatus, other than the substrate cleaning apparatus, that have treating tanks and are susceptible to posture variations when substrates are loaded, leading to the problem of scratching the substrates.

(2) The laser displacement gauge 51 acting as the detecting device may, for example, be disposed opposite each of the auxiliary transport mechanisms 11, 13 and 15 across a treating tank to measure displacements occurring at distal ends of the seating members 31. This is capable of detecting large displacements, increasing measurement resolution, and correcting displacements due to posture variations with improved accuracy. Further, an image processing device such as a camera may be used instead of the laser displacement gauge 51 to obtain similar effects.

(3) In the foregoing embodiments, only the posture of the support device is corrected according to a posture variation. Rather than correcting the posture of the support device, the transport device may have the same correcting device provided for the support device, to correct the posture of the transport device.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating substrates, comprising:
   a treating tank for receiving and treating the substrates;
   cantilever-type holding means attached to an upper position of a main column through a mounting member to be movable, while holding the substrates, between a treating position in said treating tank and a transfer position above said treating tank;
   transport means for supporting the substrates and transferring the substrates to and from said holding means in said transfer position;
   detecting means for detecting a posture variation of said holding means; and
   correcting means for correcting a position of said holding means;
   wherein said correcting means performs a correction according to the posture variation of said holding means detected by said detecting means in time of transfer of the substrates between said holding means and said transport means; and
   wherein said correcting means includes:
   a through hole formed in said mounting member constituting a cantilever proximal portion of said holding means;
   a rigid member inserted into said through hole; and
   positioning means attached to said mounting member for moving said holding means, by using said rigid member, in an opposite direction to a direction of movement of a cantilever point of said holding means;
   said positioning means including an actuator having a working piece movable into and out of an opening of said through hole to act on said rigid member.

2. A substrate treating apparatus as defined in claim 1, wherein said detecting means includes a laser displacement gauge or image processing means for performing a detection from a position spaced from said holding means.

3. A substrate treating apparatus as defined in claim 1, wherein said detecting means is mounted in a proximal portion of said holding means.

4. A substrate treating apparatus as defined in claim 2, wherein said detecting means is mounted in a proximal portion of said holding means.

5. A substrate treating apparatus as defined in claim 3, wherein said detecting means is arranged to detect an angular acceleration or a distortion.

6. A substrate treating apparatus as defined in claim 1, wherein said detecting means includes contact type detecting means for performing a detection while in contact with said holding means.

7. A substrate treating apparatus as defined in claim 1, wherein said correcting means performs a correction based on a posture of said holding device unloaded with the substrates.

8. A substrate treating apparatus as defined in claim 1, wherein said correcting means performs a correction successively while said holding device shifts between an unloaded state and a substrate holding state.

9. A substrate treating apparatus as defined in claim 1, wherein said correcting means includes advance/retreat drive means for advancing and retreating said support means along a substrate supporting side.

* * * * *